(12) United States Patent
Siarkowski

(10) Patent No.: US 7,216,318 B1
(45) Date of Patent: May 8, 2007

(54) METHOD AND SYSTEM FOR FALSE PATH ANALYSIS

(75) Inventor: Bret Siarkowski, Marlborough, MA (US)

(73) Assignee: Cadence Design Systems, Inc., San Jose, CA (US)

( * ) Notice: Subject to any disclaimer, the term of this patent is extended or adjusted under 35 U.S.C. 154(b) by 275 days.

(21) Appl. No.: 10/836,700

(22) Filed: Apr. 29, 2004

Related U.S. Application Data

(60) Provisional application No. 60/466,698, filed on Apr. 29, 2003.

(51) Int. Cl.
*G06F 17/50* (2006.01)
(52) U.S. Cl. .............................. 716/6; 716/4
(58) Field of Classification Search ............... 716/4–6, 716/18
See application file for complete search history.

(56) References Cited

U.S. PATENT DOCUMENTS

| | | | |
|---|---|---|---|
| 5,754,454 A | 5/1998 | Pixley et al. | |
| 6,408,424 B1 | 6/2002 | Mukherjee et al. | |
| 6,457,162 B1 | 9/2002 | Stanion | |
| 6,473,884 B1 | 10/2002 | Ganai et al. | |
| 6,678,645 B1 * | 1/2004 | Rajsuman et al. | 703/20 |
| 6,934,921 B1 * | 8/2005 | Gu et al. | 716/6 |
| 2002/0174407 A1 * | 11/2002 | Furusawa | 716/4 |
| 2004/0268279 A1 * | 12/2004 | Oleksinski et al. | 716/6 |

OTHER PUBLICATIONS

Ashar, P.; Dey, A.; Malik, S., "*Exploiting Multi-Cycle False Paths in the Performance Optimization of Sequential Circuits*", International Conference on Computer Aided Design, Proceedings of the 1992 IEEE/ACM international Conference on Computer-Aided Design, 1992, pp. 510-517, IEEE Computer Society Press, Santa Clara, CA, USA.

Beatty, D; Bryant, R, "*Fast Incremental Circuit Analysis Using Extracted Hierarchy*", Annual ACM IEEE Design Automation Conference, Proceedings of the 25th ACM/IEEE Conference on Design Automation, 1988, pp. 495-500, IEEE Computer Society Press, Los Alamitos, CA, USA.

Bergamaschi, R., "*The Effects Of False Paths In High-Level Synthesis*", Computer-Aided Design, ICCAD-91. Digest of Technical Papers., 1991 IEEE International Conference on, Nov. 1991, vol. 11, Issue 14, pp. 80-83, IEEE, USA.

(Continued)

*Primary Examiner*—Paul Dinh
(74) *Attorney, Agent, or Firm*—Bingham McCutchen LLP

(57) ABSTRACT

Disclosed are methods and systems for performing false path analysis. In one approach, the methods and systems identify a set of zero or more false paths based upon both implementation-specific design data and non-implementation-specific design data. In some approaches, disclosed are methods and systems for performing automated gate-level static timing false path analysis, identification, constraint generation, and/or verification using architectural information. Static timing paths at the gate-level can be linked to the architectural information via mapping techniques found in equivalence checking (EC). The gate level static timing paths can be analyzed in the context of the architectural information to identify false paths.

46 Claims, 8 Drawing Sheets

OTHER PUBLICATIONS

Burch, J; Singhal, V, *"Tight Integration Of Combinational Verification Methods"*, International Conference on Computer Aided Design Proceedings of the 1998 IEEE/ACM International Conference on Computer-Aided Design, 1998, pp. 570-576, ACM Press New York, NY, USA.

Moskewicz, M. et al, *Chaff: Engineering an Efficient SAT Solver*, Annual ACM IEEE Design Automation Conference Proceedings of the 38th Conference on Design Automation, 2001, pp. 530-535, ACM Press, New York, NY, USA.

Nekoogar, F., *"Timing Verification of Application-Specific Integrated Circuits (ASICs)"*, 1999, pp. 17-97, Prentice Hall PTR, Upper Saddle River, NJ, USA.

Nourani, M. ; Papachristou, C.; *"False Path Exclusion in Delay Analysis of RTL Structures"*, IEEE Transactions on Very Large Scale Integration (VLSI) Systems, Feb. 2002, pp. 30-43, vol. 10, Issue 1, IEEE Educational Activities Department , Piscataway, NJ, USA.

\* cited by examiner

Static timing example with a critical path that is a false path
(FP)

Equivalence checking of two designs with identical state encoding

P1-P2: RTL Don't Care false path
P3-P2: Architectural false path

METHOD AND SYSTEM FOR FALSE PATH ANALYSIS

CROSS-REFERENCE TO RELATED APPLICATIONS

The present application claims the benefit of U.S. Provisional Application No. 60/466,698, filed on Apr. 29, 2003, which is hereby incorporated by reference in its entirety.

BACKGROUND AND SUMMARY

Static timing analysis (STA) can determine if there exist paths in an electrical circuit design with delays that exceed a given timing threshold. Such paths are commonly known as critical paths (CPs). When such a critical path is identified, the portion of the design associated with the critical path may need to be modified to satisfy the required timing thresholds. It is generally not preferred to make such design modifications if they can be avoided, since each such modification consumes time and system resources, as well as possibly introducing less optimal component configurations and sizes. Since the number of such critical paths may exceed, for example, tens of thousands for large gate-level designs in a modern design, a significant amount of time and system resources may need to be expended to address all of the identified critical paths.

Therefore, it is important to accurately identify the critical paths that really need to be addressed. To date, most approaches have focused on independent efforts to improve the accuracy of RTL static timing estimation or improving the performance of traditional STA at the gate level.

The typical design flow can involve a large number of static timing analysis (STA) runs in an iterative process. Each time the design is optimized via synthesis, floor planning, place and route, in-place optimization, and/or back annotated post layout, static timing analysis can be performed. For example, STA can generate tens of thousands of critical paths (CPs) with thousands of the CPs being false paths (FPs). Typically, critical paths are analyzed, e.g. manually, and constraints can be created for the false paths, e.g. manually, and fed back to these design tools. Generation of false path constraints for a typical design can take several weeks to several months and is very error prone. For example, very often, incremental changes can be made to a design. Incremental design changes can imply that from one static timing run to the next, many of the same false path constraints still apply. However, design changes may cause some of the constraints to become invalid. The false path constraints that are manually generated initially might not be re-verified when incremental changes are made to the design. The false path constraints that are no longer valid (invalid constraints) can cause a bad design to be implemented. Using the proposed method, existing constraints can be automatically verified and/or automatically regenerated, ensuring accurate and efficient design implementation.

False path detection at the gate level has been investigated. For example, some static timing tools detect paths that are logically never used with ATPG techniques; however, these techniques have been limited to the gate level without consideration of additional constraints that can be imposed by architectural information. Moreover, many false paths cannot be identified at the gate level. The problems of identifying which critical paths are real and which as false can often involve human intervention. This human intervention can be required because the critical paths can be reported without consideration for the function of a design. There are tools that explore static timing estimation at the RTL level; however, the tools that operate at the RTL level do not consider the actual critical paths in the gate level design. These tools are for timing estimation only and are not accurate enough for timing sign off. Identification of false paths that are based on the architectural information of a design is often managed manually and can require extensive communication between the engineer that performs the static timing analysis and designers that understand the architecture of the design. The manual analysis of these critical paths can be quite time consuming and error prone, adding weeks to months in the design process. Errors in the static timing analysis could lead to the manufacture of a bad design.

Embodiments of the present invention provide a method and system for performing false path analysis to accurately identify the set of critical paths which must be addressed in a circuit design. In one embodiment, a set of false paths is identified based upon analysis of both implementation-specific design data and non-implementation-specific design data. Embodiments of the invention provide automatic methods and systems for gate-level static timing false path analysis, identification, constraint generation and/or verification using architectural information. Accurate gate level timing data in conjunction with the architectural design data and formal methods can be used to identify false paths. The combination of formal techniques with static timing analysis to identify false paths using information from the architectural information yields improved results in identifying false paths. Some embodiments can use non-formal techniques such as simulation.

In some present embodiments, by combining static timing analysis with formal techniques such as equivalence checking (EC) for mapping gate level information to architectural information, model checking to identify unreachable states, and/or automated false path analysis and constraint generation for use in identifying false paths constraints, the amount of manual effort can be minimized. Some embodiments can use nonformal techniques such as simulation.

In one or more embodiments of the invention, static timing paths at the gate-level can be linked to the architectural information via techniques such as logic cone and/or state point correspondence, such as commonly used in equivalence checking (EC). The gate-level static timing paths can be analyzed in the context of the architectural information to identify false paths. The analysis of gate-level paths in the context of the architectural information can enable identification of false paths that cannot be identified in the context of gate-level information alone. Furthermore this automated approach can be less error prone and/or much more efficient than existing techniques which are commonly manual techniques.

Various embodiments include methods performing the technology described herein, code (at least partly hardware and/or at least partly software) performing the technology described herein, and one or more computers performing the technology described herein.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE FIGURES

The accompanying drawings are included to provide a further understanding of the invention and, together with the Detailed Description, serve to explain the principles of the invention.

DETAILED DESCRIPTION

The present invention provides a method and system for performing false path analysis to accurately identify the set of critical paths that must be addressed in a circuit design. One advantage of identifying false paths (FPs) is that this identification can be used to reduce the number of critical paths that must be analyzed, redesigned, and/or modified to meet the given timing requirements for a circuit design.

Figure 1A:
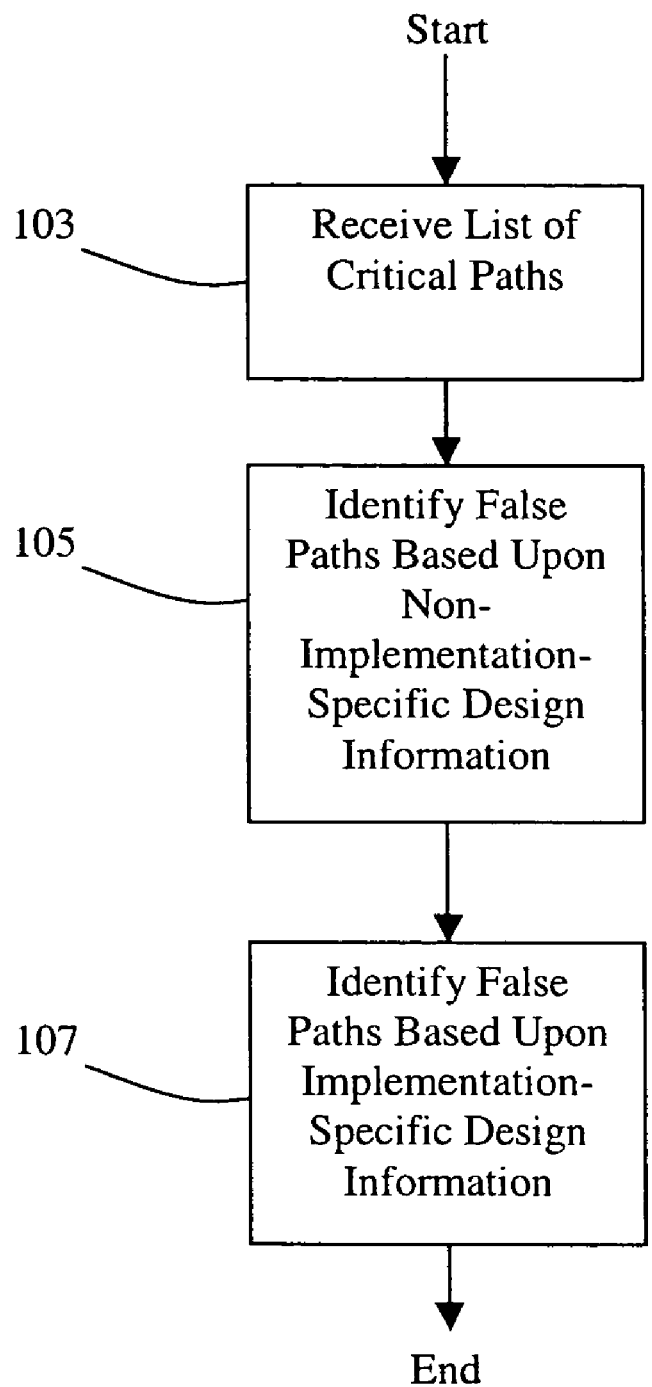
FIGS. 1A and 1B illustrate flow diagrams of processes for performing false path analysis, according to embodiments of the invention.

FIG. 1A shows a high-level flowchart of a process for performing false path analysis according to an embodiment of the invention. At 103, the process receives an initial list of one or more critical paths for the circuit design. The list of critical paths can be generated, for example, using a static timing analysis tool. By analyzing each critical path, it can be determined if the path is real or false (false paths) in the context of the design's architectural design data (also referred to as architectural information).

At 105, the process identifies a set of zero or more false paths based upon non-implementation-specific information about the circuit design. Such non-implementation-specific information includes architectural design data, which includes but is not limited to RTL code (e.g., VHDL and Verilog), behavioral code, synthesis pragmas, embedded assertions or constraints, side file assertions or constraints, macro cell information, and library information. Architectural design data can also include gate level design data augmented with architectural information such as assertions, pragmas, side-files, constraints, macro cell information, and/or library information. Architectural design data can also include any other source of data beyond bare netlists describing connections among library cells, that provides information which helps to identify false paths (e.g., helping to find: invalid constraints, inconsistent CPs, CPs that cannot be sensitized, assertion based FPs, don't care FPs, and architectural FPs). Such false paths commonly arise from, but are not limited to, synthesis don't care optimizations and/or architecturally unreachable conditions. These conditions may result in gate-level sensitizable paths, which are not sensitizable in the architectural design data or when sensitized in the context of the architectural design data, generate a don't care condition. False path information also known as constraints can be used in synthesis and place and route tools. These constraints can enable the tools to achieve desired design performance (e.g., power, area, and/or speed) and/or timing closure by focusing effort on real paths instead of false paths.

At 107, the process also identifies a set of zero or more false paths based upon implementation-specific design information. Such implementation-specific design information includes, but is not limited to, gate level design data resulting from synthesizing the circuit design. Both actions 105 and 107 may generate a list of false paths. This list of false paths can be used to prune the list of critical paths.

Figure 1B:
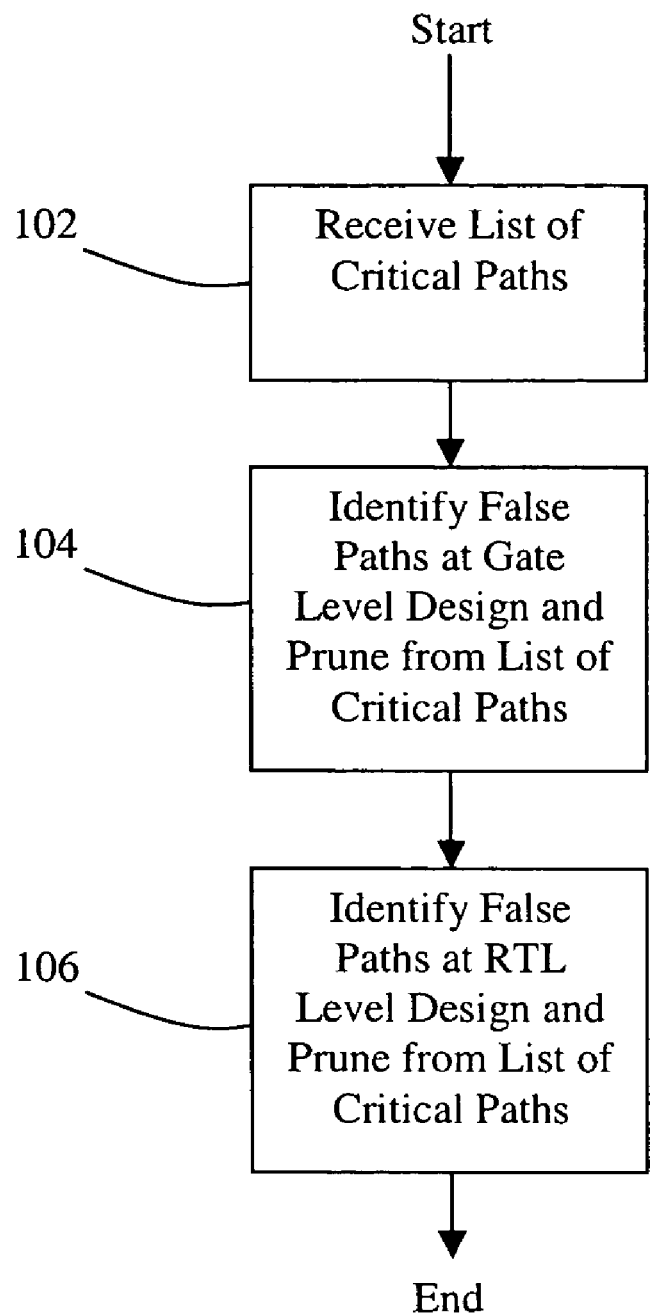

FIG. 1B shows a process for performing false path analysis for specific types of implementation-specific and non-implementation-specific design information. As before, an initial list of one or more critical paths is received by the process (102). At 104, implementation-specific design information in the form of gate-level information is used to identify a set of zero or more false paths, and then the identified set of false paths are pruned from the list of critical paths that must be addressed. In addition, non-implementation-specific design information in the form of RTL-level architectural information is used to identify a set of zero or more false paths, with these RTL-derived false paths also pruned from the list of critical paths to must be addressed (106). By automatically analyzing critical paths in the context of architectural information, and/or automatically generating false path constraints and verifying constraints at each design iteration, this can significantly improve the accuracy of the list of critical paths that must be addressed to meet timing constraints, which notably speeds up the entire design process as well as obtain better quality of results.

Various embodiments of the invention make use of equivalence checking, model checking, Binary Decision Diagrams (BDDs), Satisfiability Solvers (SAT), and/or Automatic Test Pattern Generators (ATPG) to automatically identify and analyze gate level static timing results using architectural information. Various embodiments can add, delete, combine, rearrange, and/or modify parts of this framework.

Figure 2:
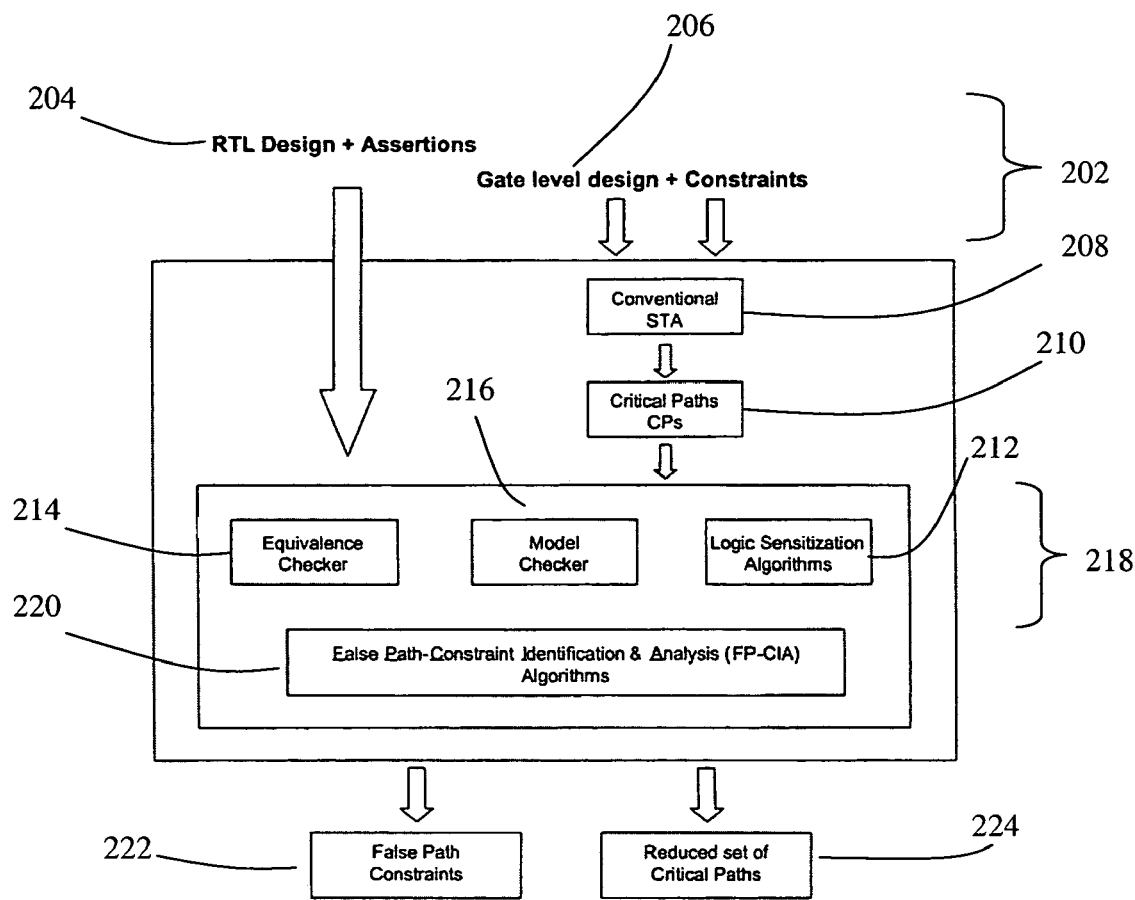
FIG. 2 illustrates a high-level framework of a formal static timing analysis system.

FIG. 2 illustrates a high-level framework/architecture for implementing an embodiment of the invention. The following items are some example components of the framework shown in FIG. 2:

Design data
   Gate level design including libraries
   Architectural information e.g., RTL design, assertions and side files
Static timing analysis data
   Initial static timing constraints
   Critical paths
Formal engines
   Equivalence checker
   Model checker
   Logic sensitization algorithms
   Solvers
False path constraint identification and analysis manager (FP-CIA) which can accept design data and static timing analysis data and uses formal engines to analyze and identify false paths (i.e., architectural, logical, don't care, multi-cycle, clock-domain crossing, delay based, etc)

Design data 202 can include a gate level net-list and the function of the library cells that are instantiated in the gate level net-list. Architectural design data can include RTL design data 204, for example source code (e.g., Verilog or VHDL) that corresponds to the gate level design data, and/or gate level design data. This RTL design data 204 can be augmented with information that can include assertions, pragmas, side-files, constraints, macro cell information, and/or library information. Architectural design data can also include gate level design data 206 augmented with architectural information such as assertions, pragmas, side-files, constraints, macro cell information, and/or library information. Architectural design data can also include any other source of data beyond bare netlists describing connections among library cells, that provides information which helps to identify false paths (e.g., helping to find: invalid constraints, inconsistent CPs, CPs that cannot be sensitized, assertion based FPs, don't care FPs, and architectural FPs). An example of an assertion is a constraint that "asserts" that two primary inputs are mutually exclusive. In some circumstances, such information cannot be derived independently from the gate level design data or the RTL design data.

Static timing analysis data 208 includes initial constraints as well as a list of critical paths 210. Examples of initial constraints include false paths in reset logic as well as false paths that originate in one clock domain and end in another clock domain. Initial constraints may also include multi-cycle path constraints. The critical path reports that are a result of running static timing analysis comprise the majority of the data set that has to be analyzed to determine which paths are real and which paths are false.

Formal engines 218 are used for solving the specific problem identified by the false path constraint identification and analysis manager. For example ATPG sensitization algorithms 212 may be employed to determine if a critical path is a false path. Equivalence checkers 214 may be employed to map a gate level logic cone into the corresponding RTL to determine if the logic resides in the "don't care" space. Model checkers 216 may be employed to determine the reachable states of a state machine. Unreachable states can be used to identify architectural based false paths. Some embodiments can use nonformal techniques such as simulation.

The false path constraint identification and analysis manager 220 accepts design data and static timing analysis data and uses formal engines to analyze and identify false paths (e.g., architectural, logical, don't care, multi-cycle, clock-domain crossing, delay based, assertion based, etc). A list of identified false paths 222 can be generated. The list of identified false paths 222 can be used throughout the design process and leveraged by other EDA mechanisms and tools, to avoid having to perform unnecessary analysis, corrections, or redesigns upon portions of the design which are associated with a false path. The identified false paths are pruned from the original list of critical paths 210 to form a reduced set of critical paths 224. The reduced set of critical paths 224 forms a smaller and more accurate list of critical paths that must be analyzed and addressed, e.g., to address portions of the design that may need to be changed to satisfy minimum timing constraints.

Figure 3:
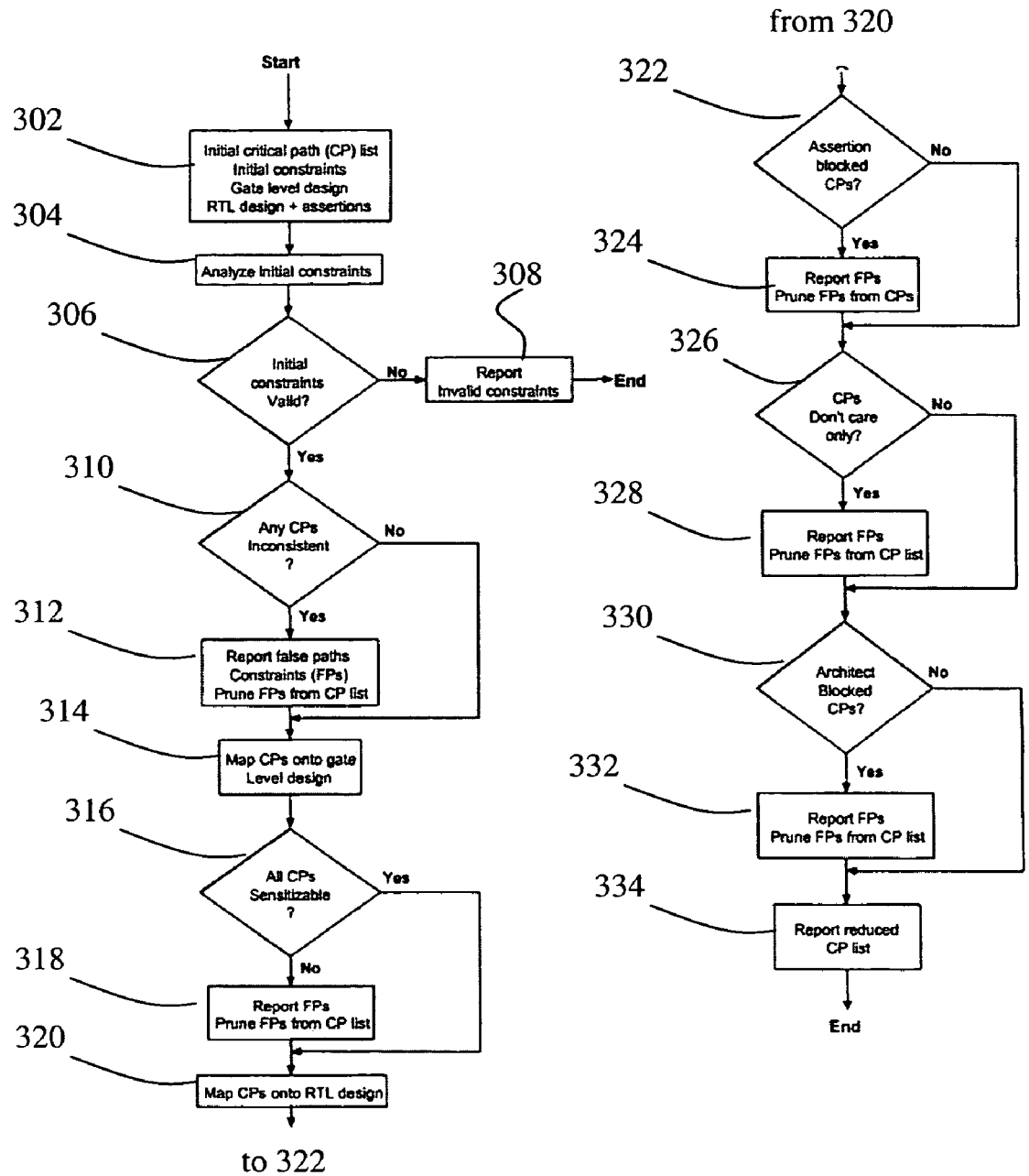
FIG. 3 illustrates a flow diagram for identifying false paths in gate level designs with corresponding architectural design data according to one embodiment of the invention.

FIG. 3 shows a flow diagram of an embodiment of a process for identifying false paths in a design. At 302, the circuit design is received for analysis, as well as other architectural information that may be useful, including, for example, a list of initial constraints and assertions. Based upon the circuit design, an initial list of critical paths is identified. Static timing analysis is one example approach that can be used to identify the initial list of critical paths. Static timing analysis (STA) is a technology that is commonly used to verify that a design (e.g., ASIC, FPGA, SOC) functions at speed. STA checks the timing of every path in a design without checking the functionality of the design. STA reports e.g. hundreds to tens of thousands of paths with timing that exceeds a threshold that could prevent a design from functioning at speed. As previously stated, these paths are called critical paths. Critical paths can be calculated without considering functionality, and many of the reported critical paths can be actually false paths. Many critical paths can be analyzed manually to determine if they are false paths. Some static timing tools have algorithms to analyze logical false paths that only occur at the gate level. However, the use of RTL information combined with the detailed timing analysis at the gate level for false path identification can provide more useful results, as described in more detail below.

In a typical design flow, there are several STA iterations. As constraints are accumulated, it is important to verify that existing constraints are still valid with any new design modifications (304). For example, the initial constraints are analyzed to ensure that the paths still exist. A determination is made at 306 whether any initial constraint s are invalid. Identification of invalid constraints causes a report to be generated and these constraints are addressed before continuing through this flow (308).

Low cost checks are applied to perform an initial evaluation of the critical path (CP) list. These low cost checks are less expensive operations that can be taken to eliminate paths before more expensive analysis operations are employed to prune the critical path list. For example, signal value consistency checks (e.g., does the CP have conflicting values on the same signal) will be generally faster than mapping the CPs onto the architectural design data and performing formal analysis to determine if the path can be sensitized. Therefore, at 310, low cost checks are performed to determine whether there exist inconsistencies with respect to the list of critical paths. If so, then the corresponding CPs that are invalid are pruned from the initial CP list (312). Subsequently, if there still remain unsolved critical paths, then several progressively aggressive techniques will be employed.

An additional technique that can be applied is to perform analysis on gate-level architectural information to identify false paths, and then to prune these false paths from the list of critical paths. In one embodiment, this is accomplished by mapping the CPs onto the gate level function (314) and applying Automatic Test Pattern Generators (ATPG) to determine if the CP can be sensitized (316). If the CP cannot be sensitized, then it is considered a logical false path (FP). Constraints for these logical FPs are automatically generated and the corresponding CPs are pruned from the list (318).

Figure 4:
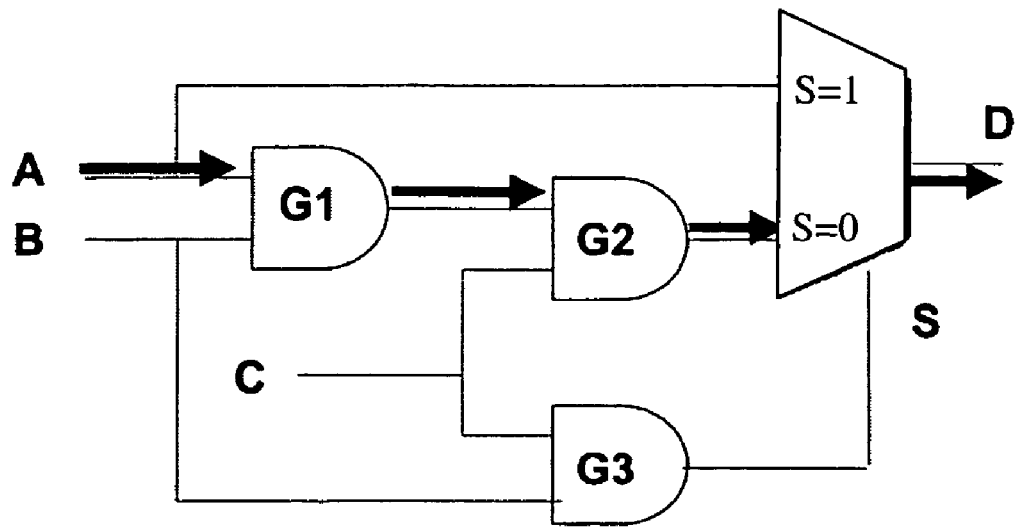
FIG. 4 illustrates a critical path that is a false path.

To illustrate, consider the example portion of a gate-level design shown in FIG. 4. This figure illustrates a critical path from input signal A->G1->G2->Multiplexer(S=O)->D. Many static timing tools would report this critical path as the longest path in this design. The delay of this critical path, which can be calculated without considering functionality, is the sum of the delay for G1, G2 and the multiplexer. A more detailed analysis of this path shows that this critical path is actually a false path. The following analysis illustrates the logical inconsistency: Signal B must be a logical one to enable signal A to pass through gate G1. Also, signal C must be a logical one for the output of G1 to pass through gate G2. Since signals B and C must both be logical one, this causes signal S to be a logical one. However, the output of G2 will pass through the multiplexer only if signal S has a value of zero which is a contradiction since it must also be a logical one. Therefore this critical path is not logically possible and considered a false path. Static timing tools that do not consider function when calculating the timing of paths place the burden of identifying false paths onto a manual process. Using the present embodiment, this false path can be automatically identified and pruned from the list of critical paths.

Returning back to FIG. 3, once some or all CPs are analyzed at the gate level, remaining CPs will be mapped onto the RTL design data (320). For example, equivalence checking techniques may be used to identify corresponding cones of logic between RTL and gate designs.

Determining that two designs (i.e., RTL and gate level) implement equivalent finite state machines (FSMs) is a fundamental step in the design and verification of digital circuit systems. This task can be performed by logic equivalence checkers, which verify the equivalence of two designs, which have identical state encoding. Equivalent or equivalence in the context of designs refers to equivalent FSMs. In the context of logic cones (described below), these terms refer to combinational equivalence.

Figure 5:
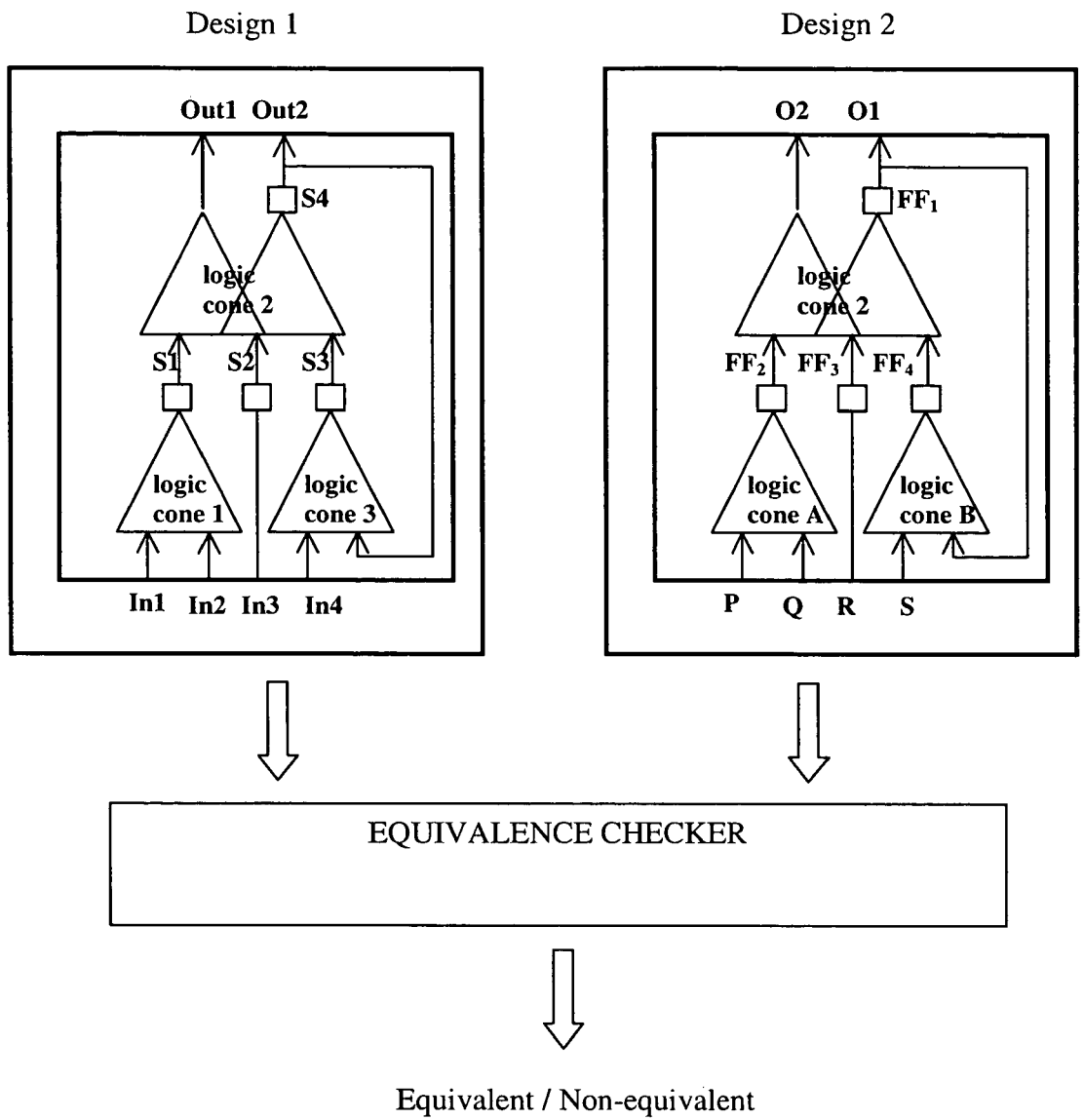
FIG. 5 illustrates the comparison of two designs which have identical state encoding.

FIG. 5 illustrates the comparison of two designs, Design 1 and Design 2, which have identical state encoding. Design 1 primary inputs {In1, In2, In3, In4} correspond to primary inputs {P, Q, R, S} in Design 2. The primary outputs {Out1, Out2} in Design 1 correspond to primary outputs {02, 01} in Design 2. The state elements, e.g. registers, of Design 1, {S4, S1, S2, S3} correspond to registers {FF1, FF2, FF3, FF4} in Design 2.

The state elements, and the primary inputs and outputs partition a design into logic cones. Logic cones are groups of combinational logic bordered by registers, and primary inputs and outputs. Design 1 (in FIG. 5) contains three logic cones, shown as logic cone 1, logic cone 2, and logic cone 3, which are delineated by the primary inputs/outputs and the registers. Note that logic cone 2 is a multi-output logic cone.

Showing that two designs with identical state encoding are equivalent can be done by showing the corresponding logic cones of the two designs to be combinationally equivalent. Identifying the corresponding logic cones can be done via a process known as mapping. Mapping logic cones in RTL designs to logic cones in gate level designs typically uses heuristics that consider design characteristics (i.e., fanin, fanout, hierarchy, signal names, logic signatures, etc.). Verifying the equivalence of Design 1 and Design 2 requires proving the 3 pairs of logic cones between Design 1 and Design 2, i.e. {logic cone 1, logic cone A}, {logic cone 2, logic cone C} and {logic cone 3, logic cone B}, are equivalent, as illustrated in FIG. 5.

Referring back to FIG. 3, once the CPs are mapped onto the RTL design, then false paths are identified at the RTL-level and are pruned from the list of critical paths. For example, some or all appropriate assertions can be identified and analyzed to identify false paths (322). Assertions may block some CPs; for example, a CP may exist if and only if two signals (A, B) are both assigned a logic one. This CP may be a false path if there is a corresponding mutually exclusive assertion on signals A and B. Some or all CPs that are blocked by assertions, denoted assertion based false paths are then pruned from the CP list (324). Again false path constraints are generated for each assertion based false path.

Another example of RTL-level analysis is to focus on the don't care (DC) space in RTL designs (326). In a typical synthesis flow there are several sources of DCs, for example logic that is assigned an "x" or an RTL case statement with a full case synthesis pragma. Remaining CPs are analyzed to determine if some or all conditions to sensitize them fall within the don't care space. If a CP exists exclusively in the don't care space, then the path is considered a don't care false path. All don't care false paths will be pruned from the CP list and constraints will be generated for this class of false paths (328).

Yet another example of RTL-level analysis, which may be the most computationally intensive, is to employ model checking techniques, such as symbolic model checking, language containment, theorem proving, etc., to determine if the remaining CPs are false paths due to architectural constraints, such as unreachable states or unreachable state transitions, etc. (330). An example of an architectural constraint is a "one-hot" state machine that has unreachable states when more than one bit is active or "hot". If a CP can only be sensitized by assigning values or a state to the state machine that contradicts the "one-hot" architectural constraint, i.e., assigning all ones to the state machine, the CP will be considered an architectural false path. All architectural false paths will be pruned from the CP list and constraints will be generated for this class of false paths (332).

Figure 6:
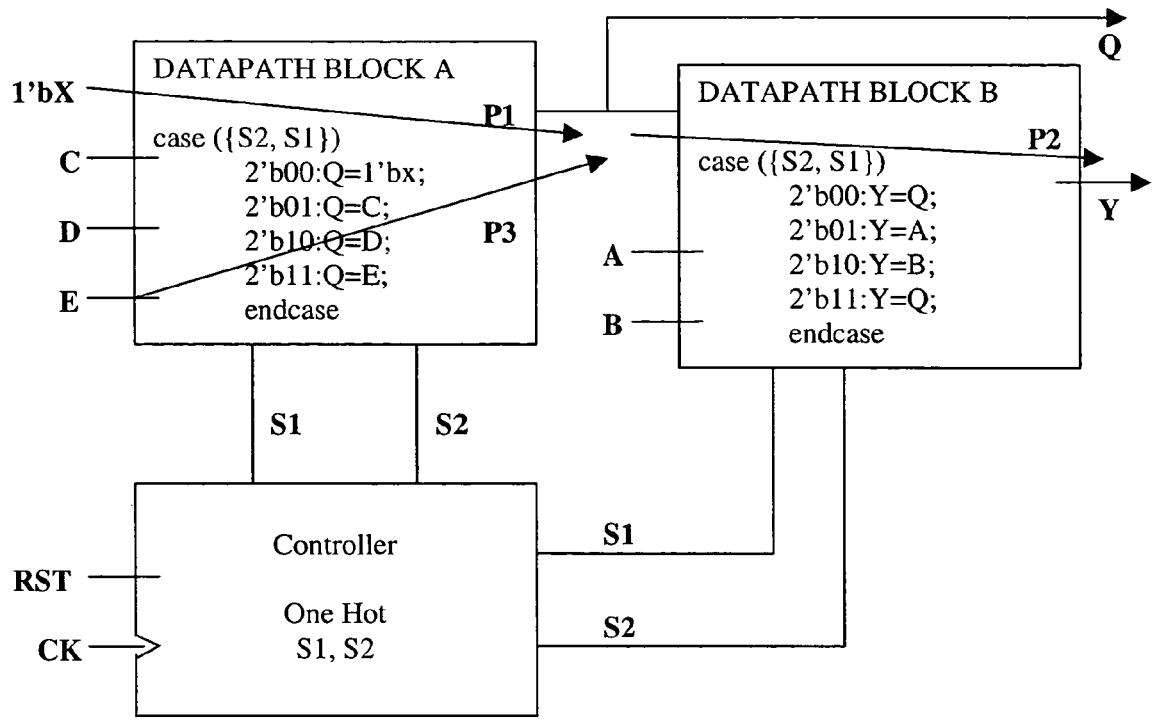
FIG. 6 illustrates RTL based false paths.

FIG. 6 illustrates an illustrative RTL design that contains a controller and two datapath blocks. Assume that this example design was run through a synthesis tool to produce a gate level design, and further assume that the target frequency for this design is 1.54 GHz using a 0.13 micron technology with the performance results from the initial synthesis run having estimated performance of 1.2 GHz. Static timing analysis can be used to identify the critical paths that were preventing the design from reaching the target frequency of 1.54 GHz. Here, there are over twenty critical paths that has to be analyzed to determine if they were false paths and could be constrained to allow synthesis to achieve the target design frequency. Assume that logical analysis at the gate level could not identify any false paths. For example, path P1->P2 is a critical path. This path occurs when S1 and S2 are both logical zero hereinafter called state0. The RTL produces a don't care or "x" in state0, however the synthesis tool produces logic for every don't care state. The RTL designer's intention is that state0 will never occur and therefore assigned an "x" in the datapath for this state. Only by analyzing the critical paths in conjunction with the architectural information, can one determine that path P1–P2 is a false path, because it always produces "don't care".

Path P3–P4 is also a false path. Upon examination of the architectural information, it is determined that the RTL code for the controller contains a one-hot condition. This "one-hot" condition prevents the controller from reaching state S1, S2 equal to binary state 11 hereinafter referred to as state3. There are several techniques to determine that state3 is an unreachable state. For example, model checking can be employed to search for all reachable states, or analysis can be performed of embedded assertions that constrain reachable states. Again, analyzing the RTL information can be required/helpful to determine that path P3->P2 is a false path.

Therefore, in this example, ten paths were found to be false paths. Once all ten paths are constrained, the synthesis tool was able to produce results of 1.56 GHz, which exceeded the original target frequency of 1.54 GHz. In some embodiments, less than all such paths can be constrained and improve results.

This capability of combining formal techniques with gate level static timing analysis and architectural information allows the critical path and false path analysis process to be broken down into a series of algorithms where each successive algorithm involves critical paths with computationally more intensive requirements. This enables a significantly faster overall process when compared with techniques that are limited to the gate level or require manual analysis of the gate level critical paths in the context of the architectural design data.

It is noted that the ordering of the false path analysis is not restricted to the exact ordering described above. For example, in an alternate embodiment of the false path analysis process, the RTL-level analysis is performed before, or concurrently with the gate-level analysis. This alternate approach may, for example, save some of the overhead and expense of performing analysis to determine if paths in the gate-level list of critical paths are sensitizable (e.g., action 316 of FIG. 3). Under this alternate approach, an initial set of critical paths is identified from the RTL-level design. This set of critical paths may be less accurate than the gate-level analysis, since the synthesis process may produce a set of physical paths that do not match exactly correspondingly to the RTL-level design. However, heuristics can be employed to anticipate the results of the synthesis process to perform a roughly comparable analysis against the RTL-level design to determine an estimate set of critical paths from the RTL-level design. The RTL-based false paths are identified from the list of RTL-level critical paths. As before, a list of gate-level critical paths is also identified. A mapping is performed to determine if any of the RTL-based false paths map onto the gate-level critical paths. If so, then these false paths are pruned from the gate-level list of critical paths. One advantage of this approach is that it limits the number of critical paths which must undergo the expense of ATPG procedures to determine if they are sensitizable. Therefore, only the remaining critical paths which do not correspond to RTL-level false paths need undergo the process to determine if they are sensitizable.

System Architecture Overview

Figure 7:
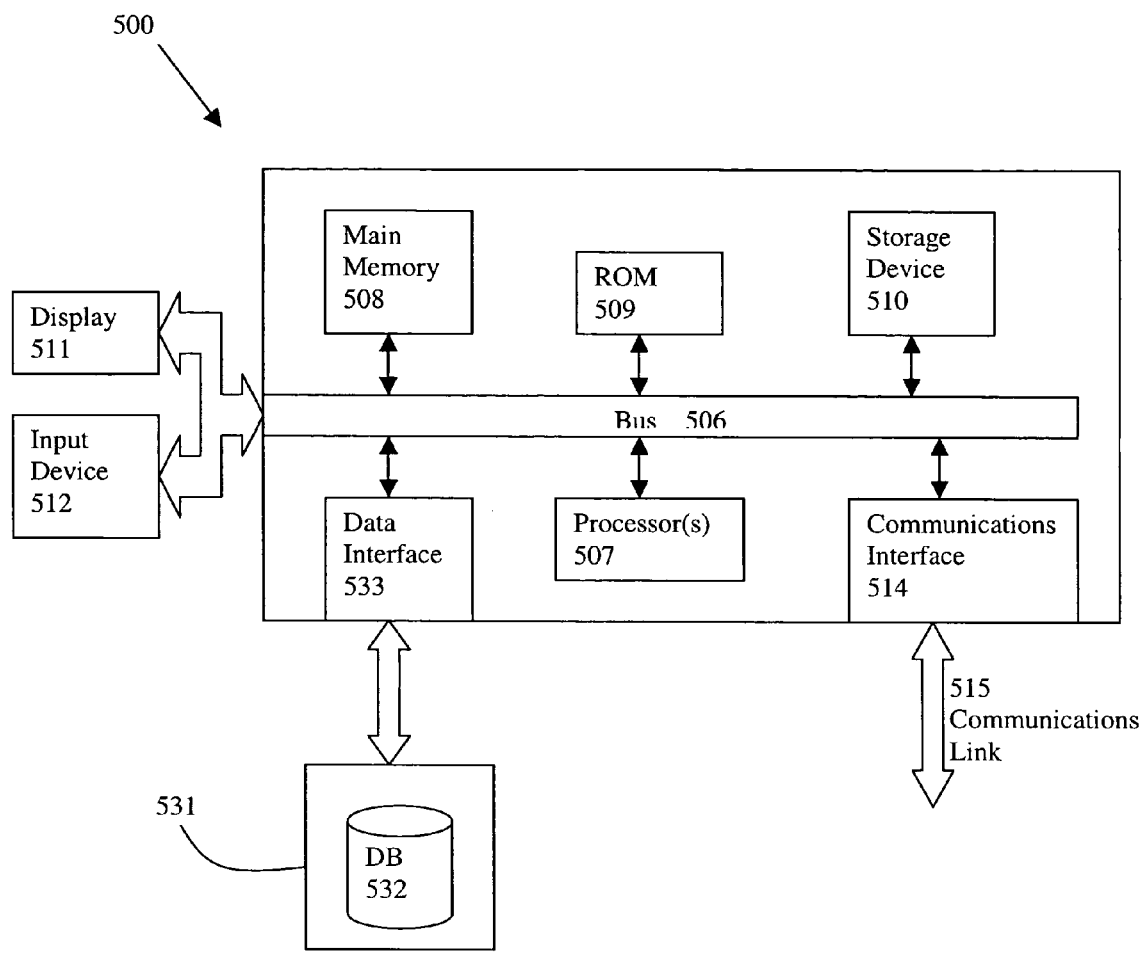
FIG. 7 illustrates an example computing architecture with which the invention may be implemented.

FIG. 7 is a block diagram of an illustrative computing system 500 suitable for implementing an embodiment of the present invention. Computer system 500 includes a bus 502 or other communication mechanism for communicating information, which interconnects subsystems and devices, such as processor 504, system memory 506 (e.g., RAM), static storage device 508 (e.g., ROM), disk drive 510 (e.g., magnetic or optical), communication interface 512 (e.g., modem or ethernet card), display 514 (e.g., CRT or LCD), input device 516 (e.g., keyboard), and cursor control 518 (e.g., mouse or trackball).

According to one embodiment of the invention, computer system 500 performs specific operations by processor 504 executing one or more sequences of one or more instructions contained in system memory 506. Such instructions may be read into system memory 506 from another computer readable/usable medium, such as static storage device 508 or disk drive 510. In alternative embodiments, hard-wired circuitry may be used in place of or in combination with software instructions to implement the invention.

The term "computer readable medium" or "computer usable medium" as used herein refers to any medium that participates in providing instructions to processor 504 for execution. Such a medium may take many forms, including but not limited to, non-volatile media, volatile media, and transmission media. Non-volatile media includes, for example, optical or magnetic disks, such as disk drive 510. Volatile media includes dynamic memory, such as system memory 506. Transmission media includes coaxial cables, copper wire, and fiber optics, including wires that comprise bus 502. Transmission media can also take the form of acoustic or light waves, such as those generated during radio wave and infrared data communications.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer can read.

In an embodiment of the invention, execution of the sequences of instructions to practice the invention is performed by a single computer system 500. According to other embodiments of the invention, two or more computer systems 500 coupled by communication link 520 (e.g., LAN, PTSN, or wireless network) may perform the sequence of instructions required to practice the invention in coordination with one another.

Computer system 500 may transmit and receive messages, data, and instructions, including program, i.e., application code, through communication link 520 and communication interface 512. Received program code may be executed by processor 504 as it is received, and/or stored in disk drive 510, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer-implemented method for performing false path analysis for electronic designs, comprising:
   receiving a list of one or more critical paths;
   mapping the list of one or more critical paths onto gate level and identifying a set of zero or more gate-level false paths by performing analysis on information comprising gate level architectural information;
   pruning the set of zero or more gate-level false paths from the list of one or more critical paths;
   mapping the list of one or more critical paths onto RTL level and identifying a set of zero or more RTL-level false paths by performing analysis on information comprising RTL level architectural information; and
   pruning the set of zero or more RTL-level false paths from the list of one or more critical paths.

2. The method of claim 1 in which static timing analysis is used to generate the list of critical paths.

3. The method of claim 1 further comprising:
   checking for constraint validity and reporting such invalid constraints if identified.

4. The method of claim 1 further comprising:
   checking for inconsistent critical paths.

5. The method of claim 4 in which the act of checking for inconsistent critical paths comprises a signal value consistency check.

6. The method of claim 5 in which the signal value consistency check comprises a check for conflicting values on a same signal.

7. The method of claim 1 in which gate-level architectural information is used to perform the act of identifying a set of gate-level false paths.

8. The method of claim 7 comprising the act of mapping critical paths onto a gate-level design.

9. The method of claim 7 comprising the act of determining if one or more critical paths can be sensitized.

10. The method of claim 9 in which an ATPG technique is used to determine if the one or more critical paths can be sensitized.

11. The method of claim 1 in which RTL-level architectural information is used to perform the act of identifying a set of RTL-level false paths.

12. The method of claim 11 comprising the act of mapping critical paths onto RTL design data.

13. The method of claim 12 in which an equivalence checker is used to map critical paths onto the RTL design data.

14. The method of claim 1 in which the set of RTL-level false path comprises a false path selected from the group consisting of: assertion-based false path, don't care path, architectural false path.

15. The method of claim 14 in which the architectural false path is based upon an unreachable state or unreachable state transition.

16. The method of claim 14 in which the architectural false path is identified with model-checking.

17. The method of claim 16 in which model-checking is performed using symbolic model checking or theorem proving.

18. The method of claim 1 in which the gate-level analysis is performed prior to the RTL-level analysis.

19. The method of claim 1, in which the architectural information comprising a RTL code, a behavioral code, an assertion, a constraint, a macro cell information, a library information, and/or a synthesis pragma.

20. The method of claim 19, in which the architectural information further comprising gate level design data augmented with architectural information.

21. A computer usable medium comprising instructions for performing a method for performing false path analysis, the method comprising the acts of:
receiving a list of one or more critical paths;
mapping the list of one or more critical paths onto gate level and identifying a set of zero or more gate-level false paths by performing analysis on information comprising gate level architectural information;
pruning the set of zero or more gate-level false paths from the list of one or more critical paths;
mapping the list of one or more critical paths onto RTL level and identifying a set of zero or more RTL-level false paths by performing analysis on information comprising RTL level architectural information; and
pruning the set of zero or more RTL-level false paths from the list of one or more critical paths.

22. The computer usable medium of claim 21 in which static timing analysis is used to generate the list of critical paths.

23. The computer usable medium of claim 21 further comprising:
checking for constraint validity and reporting such invalid constraints if identified.

24. The computer usable medium of claim 21 further comprising:
checking for inconsistent critical paths.

25. The computer usable medium of claim 24 in which the act of checking for inconsistent critical paths comprises a signal value consistency check.

26. The computer usable medium of claim 25 in which the signal value consistency check comprises a check for conflicting values on a same signal.

27. The computer usable medium of claim 21 in which gate-level architectural information is used to perform the act of identifying a set of gate-level false paths.

28. The computer usable medium of claim 27 comprising the act of mapping critical paths onto a gate-level design.

29. The computer usable medium of claim 27 comprising the act of determining if one or more critical paths can be sensitized.

30. The computer usable medium of claim 29 in which an ATPG technique is used to determine if the one or more critical paths can be sensitized.

31. The computer usable medium of claim 21 in which RTL-level architectural information is used to perform the act of identifying a set of RTL-level false paths.

32. The computer usable medium of claim 31 comprising the act of mapping critical paths onto RTL design data.

33. The computer usable medium of claim 32 in which an equivalence checker is used to map critical paths onto the RTL design data.

34. The computer usable medium of claim 21 in which the set of RTL-level false path comprises a false path selected from the group consisting of: assertion-based false path, don't care path, architectural false path.

35. The computer usable medium of claim 34 in which the architectural false path is based upon an unreachable state or unreachable state transition.

36. The computer usable medium of claim 34 in which the architectural false path is identified with model-checking.

37. The computer usable medium of claim 36 in which model-checking is performed using symbolic model checking or theorem proving.

38. The computer usable medium of claim 21 in which the gate-level analysis is performed prior to the RTL-level analysis.

39. A system for performing false path analysis, comprising:
means for receiving a list of one or more critical paths;
means for mapping the list of one or more critical paths onto gate level and identifying a set of zero or more gate-level false paths by performing analysis on information comprising gate level architectural information;
means for pruning the set of zero or more gate-level false paths from the list of one or more critical paths;
means for mapping the list of one or more critical paths onto RTL level and identifying a set of zero or more RTL-level false paths by performing analysis on information comprising RTL level architectural information; and
means for pruning the set of zero or more RTL-level false paths from the list of one or more critical paths.

40. The system of claim 39 in which static timing analysis is used to generate the list of critical paths.

41. The system of claim 39 further comprising:
checking for constraint validity and reporting such invalid constraints if identified.

42. The system of claim 39 further comprising:
means for checking for inconsistent critical paths.

43. The system of claim 39 in which gate-level architectural information is used to perform the act of identifying a set of gate-level false paths.

44. The system of claim 39 in which RTL-level architectural information is used to perform the act of identifying a set of RTL-level false paths.

45. The system of claim 39 in which the set of RTL-level false path comprises a false path selected from the group consisting of: assertion-based false path, don't care path, architectural false path.

46. The system of claim 39 in which the gate-level analysis is performed prior to the RTL-level analysis.

* * * * *